United States Patent [19]

Chénier et al.

[11] Patent Number: 4,831,327

[45] Date of Patent: May 16, 1989

[54] SELF-POWERED ELECTRICAL MEASURING SYSTEM ISOLATED FROM ELECTRICAL PERTURBANCES

[75] Inventors: André Chénier, Beloeil; André Hamel, Boucherville, both of Canada

[73] Assignee: Hydro-Quebec, Quebec, Canada

[21] Appl. No.: 44,737

[22] Filed: May 1, 1987

[51] Int. Cl.[4] .......................... G01R 19/00; G01R 1/20
[52] U.S. Cl. ...................................... 324/127; 324/96; 324/126
[58] Field of Search ................. 324/126, 127, 129, 96; 200/144 B; 340/657, 870.17; 364/492, 483

[56] References Cited

U.S. PATENT DOCUMENTS

| | | | |
|---|---|---|---|
| 2,724,821 | 11/1955 | Schweitzer, Jr. | 324/127 |
| 4,070,572 | 2/1978 | Summerhayes | 324/96 X |
| 4,158,810 | 6/1979 | Leskovar | 324/127 |
| 4,361,742 | 11/1982 | Kashiwagi et al. | 200/144 B |
| 4,497,990 | 2/1985 | Peche et al. | 200/144 B |
| 4,584,523 | 4/1986 | Elabd | 324/96 X |
| 4,616,176 | 10/1986 | Mercure et al. | 324/127 X |
| 4,618,750 | 10/1986 | Ziickler | 200/144 B X |
| 4,635,055 | 1/1987 | Fernandes et al. | 324/127 X |
| 4,709,339 | 11/1987 | Fernandes | 324/127 X |

*Primary Examiner*—Reinhard J. Eisenzopf
*Assistant Examiner*—Vinh P. Nguyen
*Attorney, Agent, or Firm*—Oblon, Fisher, Spivak, McClelland & Maier

[57] ABSTRACT

A self-powered electrical measuring system for measuring current in a high voltage circuit. The system utilizes a Rogowski coreless coil disposed about a conductor for sensing current flowing in the conductor and producing a voltage signal proportional to the magnitude of the current. An electronic conditioning circuit is provided for conditioning the voltage signal for transmission by optical link means to a remote receiver operating which is at ground potential and totally isolated from the measuring system in the high voltage circuit. A floating supply circuit uses a tapping coil, having a magnetic core disposed about the conductor, whereby to produce a supply voltage for the electronic conditioning circuit.

5 Claims, 2 Drawing Sheets

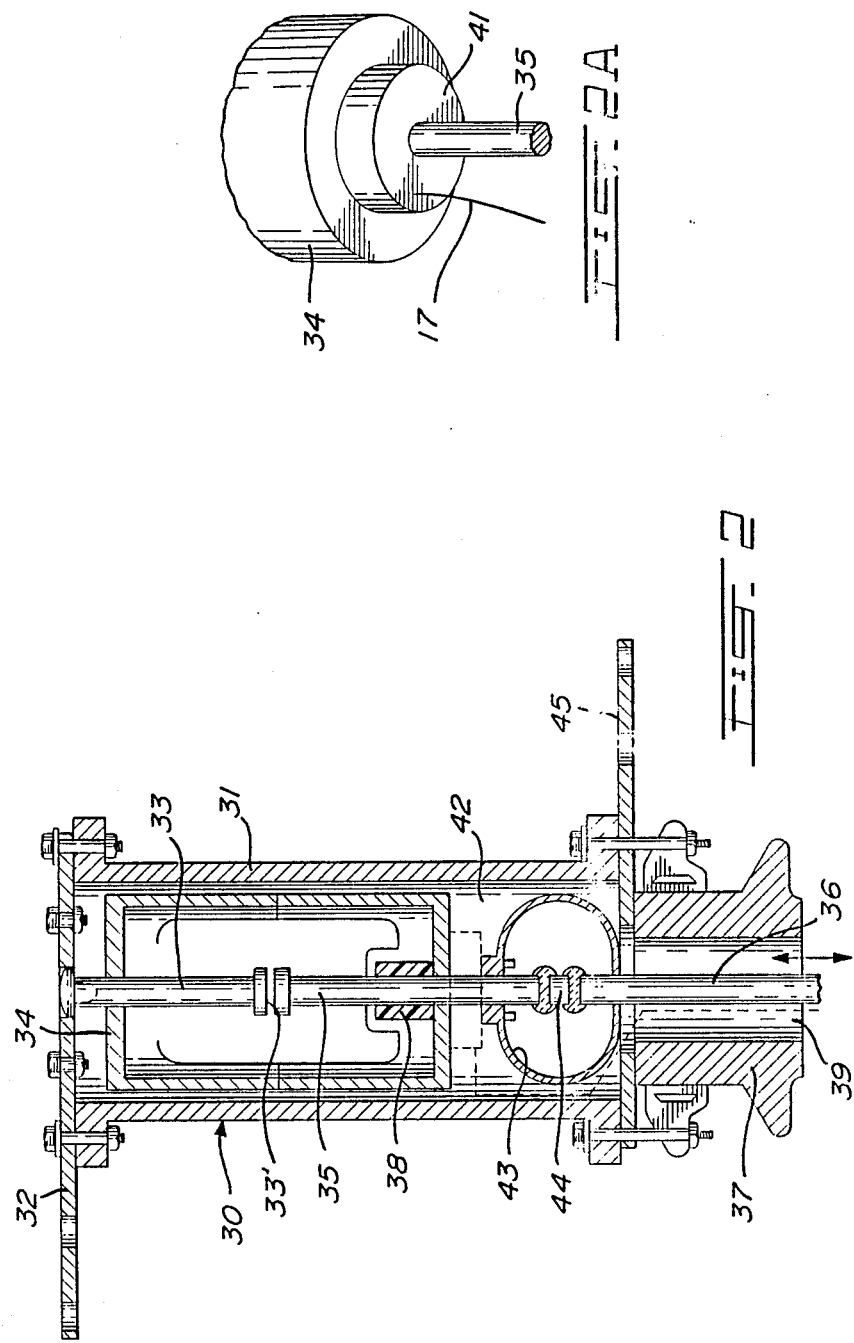

SELF-POWERED ELECTRICAL MEASURING SYSTEM ISOLATED FROM ELECTRICAL PERTURBANCES

BACKGROUND OF INVENTION

1. Field of Invention

The present invention relates to a self-powered, electrical measuring system for measuring current in a high voltage circuit and which is floating, that is totally isolated from the remote receiver at group potential.

2. Description of Prior Art

In the prior art it is known to provide current measuring transformers for measuring current in a high voltage circuit. A problem with these transformers is that they are bulky, because of the porcelain that is utilized for insulating it, and are not totally isolated from ground. They also have saturation problems because of the core transformer use gor sensing the current. Some other device uses a coreless transformer but require periodic maintenance due to the use of batteries, etc.

SUMMARY OF INVENTION

It is a feature of the present invention to provide a novel, self-powered, totally isolated from ground, electrical measuring system for measuring current in a high voltage circuit and which substantially overcomes of the above-mentioned disadvantages of the prior art.

Another feature of the present invention is to provide a precise measurement of the current over a wide range, does not require maintenance, is light weight, and can be easily integrated with existing high voltage circuit breaker equipment, does not saturate, and is economical to produce.

According to the above features, from a broad aspect, the present invention provides a self-powered electrical measuring system for measuring current in a high-voltage circuit. The system comprises current measuring means for sensing a current flowing in a conductor and producing a voltage signal proportional to the magnitude of the current. Electronic conditioning circuit means is provided for conditioning the voltage signal for transmission by optical link means to a remote receiver operating at ground potential and totally isolated from the measuring and transmission system placed in the high voltage circuit. Floating supply means is also provided for deriving a supply voltage from the conductor for the electronic conditioning circuit means.

BRIEF DESCRIPTION OF DRAWINGS

A preferred embodiment of the present invention will now be described with reference to the accompanying drawings in which:

FIG. 2 shows an application of the system in a high-voltage switch; and FIG. 2A is a perspective view from underneath the vacuum chamber and of the movable contact.

DESCRIPTION OF PREFERRED EMBODIMENTS

Figure 1:
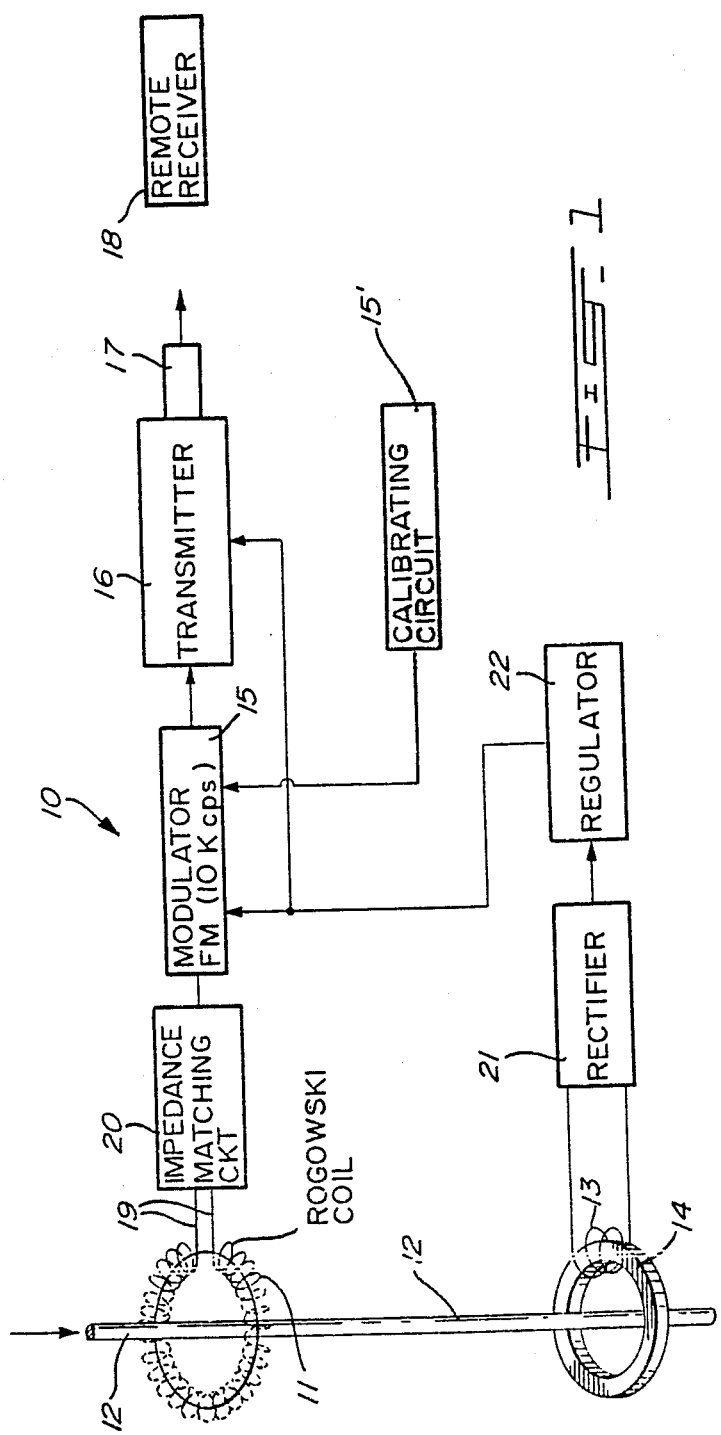
FIG. 1 is a schematic view of the self-powered electrical measuring system of the present invention.

Referring now to the drawings and more particularly to FIG. 1, there is shown generally at 10 the self-powered electrical measuring system of the present invention and comprising essentially a current measuring means in the form of a Rogowski coil 11 positioned about a conductor 12 of a high-voltage circuit the through which a current circulates. A local supply circuit which is constituted basically by a tapping coil 13 having a magnetic core 14 is also disposed about the conductor 12 to tap a voltage through inductance caused by the current flowing through the conductor 12. This voltage supplies the electronic conditioning circuits which consist essentially of a modulator 15 and a transmitter 16 which modulate an output voltage signal from the Rogowski coil for transmission of same on a optical link, herein an optical link 17 for transmission of the measured signal to a remote receiver circuit 18 located a distance from the transmitter and operating at ground potential. The receiver is also substantially isolated from electrical perturbances.

The construction of the Rogowski coil 11 is well known in the art and produces an output signal at the output tap 19 of the coil which is proportional to the current flowing in the conductor 12. By selecting the proper criterias in the construction of the coil 11, such as the number of turns or the section of the coil and the radius of the coil, we can obtain an output signal voltage of one or few millivolts per amperes of current flowing in the conductor 12. This coil possesses a fairly large dynamic band as it does not use a magnetic core and because of that it cannot saturate. Therefore, it is possible to measure currents from a few amperes to several thousands of amperes which are converted into millivolts or volts. The output signal in millivolts or volts can be calculated in accordance with the following formula:

$$E = \left(2 \times 10^{-7} \cdot \frac{NA}{R}\right) \text{Henrys} \cdot \frac{dI}{dT}$$

where:

E is the voltage,
N the number of turns (about 1000),
A the section of the coil,
R the radius of the coil,
I the current, and
t the time.

The output voltage signal at terminals 19 is connected to an impedance matching circuit 20 followed by the modulator circuit 15. The calibration circuit 15' is connected to the modulator 15 to select the desired modulating frequency of the voltage signal. The output of the modulator 15 is connected to a transmitter 16. Although the transmitter 16 as herein shown is an optical transmitter 16, it is also within the scope of the invention to use an infrared transmitter for transmitting infrared signals to a infrared receiver. The signal output of the receiver circuit 18 may be provided in any suitable form such as a voltage or current reading which may be displayed and printed and this permits the system to be adapted to all types of measuring devices.

The tapping coil 13 had the output thereof connected to a voltage rectifier 21 followed by a voltage regulator 22 which is connected to the modulator 15 and the transmitter circuit 16 whereby to feed the operating voltage of various components therein. The magnetic core 14 has very good magnetic permeability to tap the magnetic energy produced by the current flowing in the conductor 12. The number of turns of the coil 13 must be selected to produce a voltage having a sufficient voltage level (approximately 5 volts DC) even when the current flowing in the conductor 12 is weak. The voltage regulator 22 regulates the output voltage to the desired level. It is also pointed out that when the current in the conductor 12 is very high, such as during a short-circuit condition, this current may attain a level that would damage or affect the functioning of the electronic circuit. However, in order to limit the voltage level, during short-circuit conditions or high current flow, the dimension of the core 14 is selected whereby it will produce sufficient voltage during low current condition but will saturate during very high current surges, such as short conditions. When saturating the magnetic coupling becomes much less efficient and the induced energy is limited to a level which is much lower that it would have been without saturation. This also prevents the circuit from heating during high current operating conditions. It is pointed out that even if the core 14 saturates, it in no way affects the measuring voltage signal at the output of the Rogowski coil 11 which functions entirely independently.

For the application of the measuring circuit of the present invention, the number of turns of the coil 11 and the dimension of the core have been selected to permit the electronic circuits to measure currents inferior to 5 amperes and not be damaged at currents up to about 10 kA.

Referring to FIG. 2, there is shown a typical application of the self-powered electrical measuring system 10 of the present invention. As herein shown, this system is incorporated within an automatic high-voltage switch 30 which consists of a porcelain envelope or housing 31 having an input terminal 32 connectable to a high-voltage conductor (not shown) and to a fixed contact 33 located within a vacuum chamber 34 within the housing 31. An axially movable contact 35 in the form of a rod is spaced from the free end 33' of the fixed contact and displaceable to and away from that free end by an insulating rod 36 extending in a porcelain insulating column 37 of the switch. A portion of the contact rod 35 extends out of the chamber 34 through a seal 38 and it is about this exterior portion of the rod that the measuring system 10 is located.

As shown in the exploded view of FIG. 2, the measuring apparatus of the present invention is housed within a toroidal shape metal housing 41 which is disposed about the conductive contact rod 35. The metal housing 41 shields the measuring system from environmental electrical perturbances. The optical fiber transmission line 17 extends from the housing 41 and down through the bore 39 of the porcelain insulating column 37. It is pointed out that the toroidal shape metal housing 41 is at the same potential as the moving contact 35 extending therethrough. Accordingly, the measuring system of the present invention is also shielded from any foul climatic conditions outside the porcelain envelope 31.

The interior of the housing 42 may also be filled with a dielectric compound. The flexible blades 43 are disposed about the coupling 44, and the insulated actuating rod 36, making the connection between the moving contact 35 and the connector 45 on top of the porcelain column 37.

Although FIG. 2 illustrates a typical application of the current measuring circuit of the present invention, it is pointed out that it should not be limited to this application and has many other uses and adaptations. It is therefore, within the ambit of the present invention to cover any obvious modifications provided such modifications fall within the scope of the appended claims.

We claim:

1. A self-powered electrical measuring system for measuring current in a high-voltage circuit, said system comprising:

current measuring means for sensing a current flowing in a conductor and producing a voltage signal proportional to the magnitude of said current, said current measuring means being a Rogowski coil disposed about said conductor, said coil producing said output signal in terms of about a few mv per Amp. and in accordance with the following formula:

$$E = \left(2 \times 10^{-7} \cdot \frac{NA}{R}\right) \text{Henrys} \cdot \frac{dI}{dT}$$

where:
E is the voltage,
N is the number of turns (about 1000),
A the section of the coil,
R the radius of the coil,
I the current, and
T the time, electronic conditioning circuit means for conditioning said signal for transmission by optical link means to a remote receiver operating at ground potential and which is totally isolated from the high voltage circuit, said electronic conditioning circuit means having a modulator circuit for receiving said signal from said Rogowski coil and modulating same for transmission by a transmitter circuit connected thereto, said transmitter circuit generating a composite modulated signal over said optical link means, a floating supply means for deriving a supply voltage from the conductor for feeding said electronic conditioning circuit means, said floating supply means having a tapping coil with a magnetic core disposed about said conductor for tapping, by magnetic inductance caused by current flow in said conductor, sufficient voltage to feed said electronic conditioning circuit means; said tapping coil having a sufficient number of turns to generate said sufficient voltage even at low current flow in said conductor, said magnetic core having a selected dimension so as to saturate during high current surges such as occurs during a short-circuit condition, said system being located within a module is a toroidal shape metal housing disposed about said conductor and shielding said system from environmental electrical perturbances, a vacuum chamber is provided within said metal housing and has a fixed contact therein secured to a high-voltage line, an axially movable conductive contact rod is displaceably supported in sealing engagement with said vacuum chamber and as a portion extending exteriorly of said chamber, said toroidal shape metal housing being disposed about a portion of said contact rod exteriorly of said chamber with said Rogowski coil and tapping coil positioned thereabout.

2. A measuring system as claimed in claim 1, wherein said link means is an optical transmission line.

3. A measuring system as claimed in claim 1, wherein said link means is an infrared signal transmitted to said remote receiver.

4. A measuring system as claimed in claim 1, wherein said conditioning circuit further comprises a calibrating circuit to select a desired modulating frequency, said tapping coil being connected to a voltage rectifier and voltage regulator to feed an operating voltage to said modulator and transmitter circuits.

5. A self-powered electrical measuring system for measuring current in a high-voltage circuit, said system comprising:

current measuring means for sensing a current flowing in a conductor and producing a voltage signal proportional to the magnitude of said current, said current measuring means being a Rogowski coil disposed about said conductor, said coil producing said output signal in terms of about a few mv per Amp. and in accordance with the following formula:

$$E = \left(2 \times 10^{-7} \cdot \frac{NA}{R}\right) \text{Henrys} \cdot \frac{dI}{dT}$$

where:
E is the voltage,
N the number of turns (about 1000),
A the section of the coil,
R the radius of the coil,
I the current, and
T the time, electronic conditioning circuit means for conditioning said signal for transmission by optical link means to a remote receiver operating at ground potential and which is totally isolated from the high voltage circuit, said electronic conditioning circuit means having a modulator circuit for receiving said signal from said Rogowski coil and modulating same for transmission by a transmitter circuit connected thereto, said transmitter circuit generating a composite modulated signal over said optical link means, a floating supply means for deriving a supply voltage from the conductor for feeding said electronic conditioning circuit means, said floating supply means having a tapping coil with a magnetic core disposed about said conductor for tapping, by magnetic inductance caused by current flow in said conductor, sufficient voltage to feed said electronic conditioning circuit means; said tapping coil having a sufficient number of turns to generate said sufficient voltage even at low current flow in said conductor, said magnetic core having a selected dimension so as to saturate during high current surges such as occurs during a short-circuit condition, said conditioning circuit having a calibrating circuit to select a desired modulating frequency, said tapping coil being connected to a voltage rectifier and voltage regulator to feed an operating voltage to said modulator and transmitter circuits.

* * * * *